US010707797B2

(12) United States Patent
Yamada et al.

(10) Patent No.: US 10,707,797 B2
(45) Date of Patent: Jul. 7, 2020

(54) MOTOR CONTROL APPARATUS, MOTOR CONTROL PROGRAM, AND MOTOR CONTROL METHOD

(71) Applicant: TOYOTA JIDOSHA KABUSHIKI KAISHA, Toyota-shi (JP)

(72) Inventors: Masaki Yamada, Toyota (JP); Hiroyuki Iyama, Okazaki (JP); Yu Sasaki, Toyota (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 16/254,812

(22) Filed: Jan. 23, 2019

(65) Prior Publication Data
US 2019/0288626 A1    Sep. 19, 2019

(30) Foreign Application Priority Data

Mar. 15, 2018 (JP) ................................ 2018-047831

(51) Int. Cl.
*H02P 7/00* (2016.01)
*H02P 23/14* (2006.01)
(Continued)

(52) U.S. Cl.
CPC ............ *H02P 23/14* (2013.01); *G01R 31/343* (2013.01); *H02P 6/085* (2013.01); *H02P 25/024* (2016.02); *H02P 27/08* (2013.01); *H02P 29/0241* (2016.02)

(58) Field of Classification Search
CPC .............................. H02P 29/0241; H02P 6/085
(Continued)

(56) References Cited

U.S. PATENT DOCUMENTS 6,462,491 B1 * 10/2002 Iijima ....................... H02P 9/18
                                                             318/400.09
2013/0043817 A1 * 2/2013 Shibuya ................. H02P 6/182
                                                             318/400.33
(Continued)

FOREIGN PATENT DOCUMENTS

EP          1 981 164 A2      10/2008
JP          2009-112143        5/2009
(Continued)

OTHER PUBLICATIONS

Won, I-K. et al. "Position sensorless control method of IPMSM applying three shunt sensing PWM inverter using predictive current" 20th International Conference on Electrical Machines and Systems (ICEMS), IEEE, XP033161237, 2017, 6 Pages.

*Primary Examiner* — Eduardo Colon Santana
*Assistant Examiner* — Gabriel Agared
(74) *Attorney, Agent, or Firm* — Oblon, McClelland, Maier & Neustadt, L.L.P.

(57) ABSTRACT

A motor control apparatus includes a current estimation unit configured to output a detected current value corresponding to each of the three-phase AC currents based on the measured current value and rotor rotation angle information of the motor. The current estimation unit defines a phase whose duty ratio of a driving pulse supplied to an inverter circuit, which generates the three-phase AC currents, becomes more than or equal to an operation switching threshold as an estimation target phase, calculates, for the estimation target phase, an estimated current value based on a coefficient value, which is calculated from the measured current value by the current measurement unit in a period in which the duty ratio of the driving pulse is lower than the operation switching threshold, and the rotor rotation angle informa-
(Continued)

tion, and outputs the calculated estimated current value as the detected current value of the estimation target phase.

7 Claims, 14 Drawing Sheets

(51) Int. Cl.
  *G01R 31/34* (2020.01)
  *H02P 27/08* (2006.01)
  *H02P 25/024* (2016.01)
  *H02P 6/08* (2016.01)
  *H02P 29/024* (2016.01)
(58) Field of Classification Search
  USPC .......................................................... 318/490
  See application file for complete search history.

(56) References Cited

U.S. PATENT DOCUMENTS

2013/0334995 A1* 12/2013 Kuroda .................... H02P 27/06
  318/400.27
2014/0091742 A1* 4/2014 Suzuki .................. H02P 29/027
  318/400.22

FOREIGN PATENT DOCUMENTS

| JP | 2013-247832 | 12/2013 |
| JP | 2014-72973 | 4/2014 |

* cited by examiner

MOTOR CONTROL APPARATUS, MOTOR CONTROL PROGRAM, AND MOTOR CONTROL METHOD

CROSS REFERENCE TO RELATED APPLICATIONS

This application is based upon and claims the benefit of priority from Japanese patent application No. 2018-047831, filed on Mar. 15, 2018, the disclosure of which is incorporated herein in its entirety by reference.

BACKGROUND

The present disclosure relates to a motor control apparatus, a motor control program, and a motor control method for controlling rotation of a motor by feeding back a rotation angle of a rotor.

In the motor control, various control on the motor is performed by feeding back a driving current for driving the motor. Japanese Unexamined Patent Application Publication No. 2009-112143 discloses an example of this control. In Japanese Unexamined Patent Application Publication No. 2009-112143, as an example, when currents of a three-phase AC motor are controlled based on three-phase current values Iu, Iv, and Iw detected by a current sensor and externally instructed current command values Id* and Iq*, a calculation for the current control is carried out using two-phase current values from among the detected three-phase current values excluding the current phase having a maximum absolute value, and the three-phase AC motor is controlled based on a result of the calculation. Japanese Unexamined Patent Application Publication No. 2009-112143 discloses another example that focuses on the fact that a sum of the three-phase current values Iu, Iv, and Iw becomes substantially zero and in which an abnormality in the motor such as an abnormality in the current sensor is detected (Paragraph 0046 of Japanese Unexamined Patent Application Publication No. 2009-112143 etc.).

SUMMARY

In order to detect current values of three-phase currents, a magnitude of the three-phase currents is measured using a current sense resistor provided in an inverter. At this time, the inverter operates using a PWM (Pulse Width Modulation) signal as a driving signal. When a duty ratio of this driving signal is high at the time of measuring the current values of the three-phase currents, the current value may not be measured correctly. There is a problem that such a measurement error in the current value may cause the accuracy of the motor control processing or the abnormality detection processing to decrease.

The present disclosure has been made to solve such a problem. An object of the present disclosure is to improve the accuracy of motor control based on current values of three-phase currents.

A first example aspect of the present disclosure is a motor control apparatus for feedback-controlling a motor driven by three-phase AC currents. The motor control apparatus includes: a current measurement unit configured to measure at least two current values among the three-phase AC currents supplied to the motor as measured current values; and a current estimation unit configured to output a detected current value corresponding to each of the three-phase AC currents based on the measured current value and rotor rotation angle information of the motor. The current estimation unit defines a phase whose duty ratio of a driving pulse supplied to an inverter circuit, which generates the three-phase AC currents, becomes more than or equal to an operation switching threshold as an estimation target phase, calculates, for the estimation target phase, an estimated current value based on a coefficient value, which is calculated from the measured current value by the current measurement unit in a period in which the duty ratio of the driving pulse is lower than the operation switching threshold, and the rotor rotation angle information of the motor, and outputs the calculated estimated current value as the detected current value of the estimation target phase.

According to the first example aspect, the motor control apparatus replaces the measured current value acquired at the time when the duty ratio of the driving pulse is high, which is when an erroneous measurement of the current value is likely to occur, by the estimated current value estimated based on the rotor rotation angle information and the coefficient value in order to generate the detected current value. By doing so, the motor control apparatus according to the first example aspect improves the accuracy of the detected current value used in the subsequent processing.

In the motor control apparatus according to a second example aspect of the present disclosure, the current measurement unit outputs the three measured current values corresponding to respective phases of the three-phase AC currents, the current estimation unit outputs the three measured current values corresponding to respective phases of the three-phase AC currents, and the motor control apparatus further comprises a failure detection unit configured to detect that a failure has occurred in the motor when a sum of the three detected current values exceeds a preset abnormality determination threshold.

According to the second example aspect, the motor control apparatus can detect an abnormality in the motor based on the three detected current values that are highly accurate.

In the motor control apparatus according to a third example aspect of the present disclosure, the current measurement unit outputs the two measured current values corresponding to two phases among the phases of the three-phase AC currents as a first measured current value and a second measured current value, respectively, and the current estimation unit outputs a first detected current value corresponding to the first measured current value and a second detected current value corresponding to the second measured current value, calculates a value obtained by subtracting the second detected current value from a value obtained by making the first detected current value negative as a third detected current value, and outputs the third detected current value together with the first detected current value and the second detected current value.

According to the third example aspect, the motor control apparatus generates the highly accurate first detected current value and second detected current value, and generates the third detected current value based on these detected currents. By doing so, it is possible to highly accurately control the motor based on a feedback current generated from the current values acquired from an inverter circuit of two shunt configuration.

In the motor control apparatus according to a fourth example aspect of the present disclosure, for each phase of the three-phase AC currents, the current estimation unit calculates the coefficient value by dividing the measured current value obtained by the current measurement unit in the period in which the duty ratio of the driving pulse is lower than the operation switching threshold by a value of the rotor rotation angle information at the time when the measured current value is measured, and the current estimation unit updates the coefficient value each time the measured current value is input in the period in which the duty ratio of the driving pulse is lower than the operation switching threshold.

According to the fourth example aspect, in the motor control apparatus, the coefficient value is updated in accordance with an acquisition cycle of the measured current value. By doing so, the motor control apparatus can improve the followability of the estimated current value to the measured current value whose maximum value varies, and thus can calculate the estimated current value with high accuracy.

In the motor control apparatus according to a fifth example aspect of the present disclosure, when the measured current value corresponding to one of the phases of the three-phase AC currents is defined as a first rotor rotation detected current value and the measured current value corresponding to another one of the phases of the three-phase AC currents is defined as a second rotor rotation detected value, when a relationship between the first rotor position detected current value and the second rotor position detected current value matches preset rotor rotation feature point information, the current estimation unit performs coefficient estimation processing in which a rotor rotation angle value determined corresponding to the rotor position feature point information is calculated as a rotor rotation angle estimated value indicating a rotor rotation angle of the motor, the coefficient value is calculated by dividing the first rotor position detected current value by the rotor rotation angle estimated value, and the first rotor position detected current value and the second rotor position detected current value are output as the detected current values.

According to the fifth example aspect, the motor control apparatus can accurately calculate the coefficient value according to a generation interval of the rotor rotation angle information acquired from an angle sensor for detecting the rotor angle of the motor or the acquisition cycle of the measured current value.

In the motor control apparatus according to a sixth example aspect of the present disclosure, when the duty ratio of the driving pulse supplied to the inverter circuit, which generates the three-phase AC currents, is lower than the preset operation switching threshold, the current estimation unit outputs the measured current value as the detected current value.

According to the sixth example aspect, the motor control apparatus uses the current value measured by the current measurement unit as the detected current value in a period in which the duty ratio of the driving pulse is lower than the preset operation switching threshold to thereby perform processing based on actual measured current value.

A motor control program according to the present disclosure executed by an arithmetic unit of a motor control apparatus for feedback-controlling the motor including the arithmetic unit for executing a program and a current measurement unit for measuring, as measured current values, at least two current values of three-phase AC currents that drive the motor executes: current estimation processing that outputs a detected current value corresponding to each of the three-phase AC currents based on the measured current value and rotor rotation angle information of the motor. In the current estimation processing, the current estimation unit defines a phase whose duty ratio of a driving pulse supplied to an inverter circuit, which generates the three-phase AC currents, becomes more than or equal to an operation switching threshold as an estimation target phase, calculates, for the estimation target phase, an estimated current value based on a coefficient value, which is calculated from the measured current value by the current measurement unit in a period in which the duty ratio of the driving pulse is lower than the operation switching threshold, and the rotor rotation angle information of the motor, and outputs the calculated estimated current value as the detected current value of the estimation target phase.

According to the above example aspect of the motor control program, the motor control program replaces the measured current value acquired at the time when the duty ratio of the driving pulse is high, which is when an erroneous measurement of the current value is likely to occur, by the estimated current value estimated based on the rotor rotation angle information and the coefficient value in order to generate the detected current value. By doing so, the motor control program according to the first example aspect improves the accuracy of the detected current value used in the subsequent processing.

A motor control method of a motor control apparatus including a current measurement unit for measuring, as measured current values, at least two current values of three-phase AC currents to be supplied to a motor and a current estimation unit for outputting a detected current value to each of the three-phase AC currents based on the measured current values and rotor rotation angle information of the motor according to the present disclosure includes: performing current estimation processing that outputs a detected current value corresponding to each of the three-phase AC currents based on the measured current value and rotor rotation angle information of the motor. In the current estimation processing, the current estimation unit defines a phase whose duty ratio of a driving pulse supplied to an inverter circuit, which generates the three-phase AC currents, becomes more than or equal to an operation switching threshold as an estimation target phase, calculates, for the estimation target phase, an estimated current value based on a coefficient value, which is calculated from the measured current value by the current measurement unit in a period in which the duty ratio of the driving pulse is lower than the operation switching threshold, and the rotor rotation angle information of the motor, and outputs the calculated estimated current value as the detected current value of the estimation target phase.

According to the above example aspect of the motor control method, the measured current value acquired at the time when the duty ratio of the driving pulse is high, which is when an erroneous measurement of the current value is likely to occur, is replaced by the estimated current value estimated based on the rotor rotation angle information and the coefficient value in order to generate the detected current value. By doing so, the motor control method according to the present disclosure improves the accuracy of the detected current value used in the subsequent processing.

According to the present disclosure, it is possible to provide a motor control apparatus, a motor control program, and a motor control method that perform motor control with high accuracy by increasing the accuracy of a detected current value calculated from a measured value of a driving current.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

Figure 1:
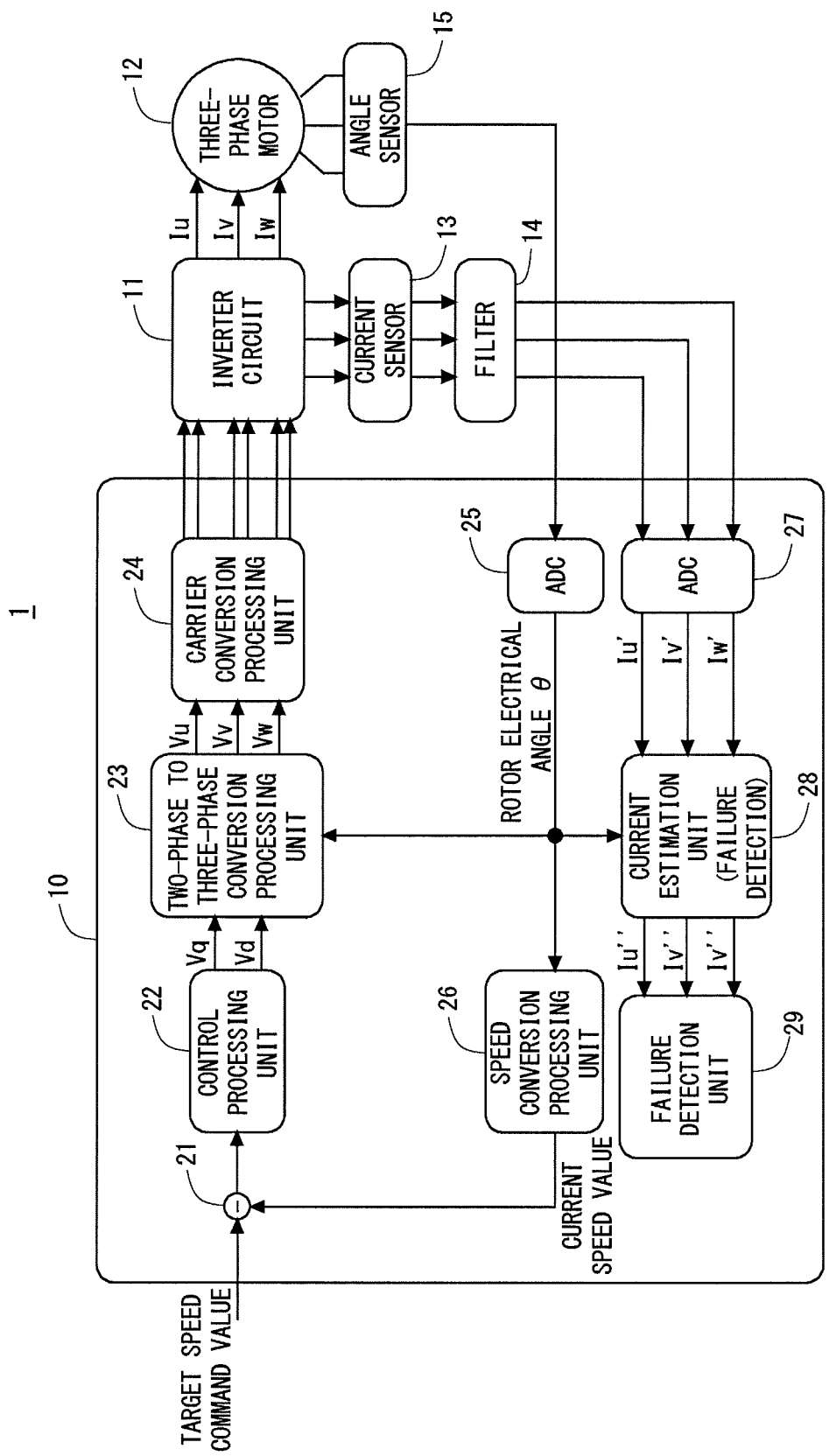
FIG. 1 is a block diagram of a motor control system according to a first embodiment.

For the clarification of the description, the following description and the drawings may be omitted or simplified as appropriate. Further, each element shown in the drawings as functional blocks that perform various processing can be formed of a CPU (Central Processing Unit), a memory, and other circuits in hardware and may be implemented by programs loaded into the memory in software. Those skilled in the art will therefore understand that these functional blocks may be implemented in various ways by only hardware, only software, or the combination thereof without any limitation. Throughout the drawings, the same components are denoted by the same reference signs and overlapping descriptions will be omitted as appropriate.

The above program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (Read Only Memory), CD-R, CD-R/W, and semiconductor memories (such as mask ROM, PROM (Programmable ROM), EPROM (Erasable PROM), flash ROM, RAM (Random Access Memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

First Embodiment

First, FIG. 1 shows a block diagram of a motor control system 1 according to a first embodiment. As shown in FIG. 1, the motor control system 1 according to the first embodiment uses a motor control apparatus 10 to control a three-phase motor 12. A large electric power is required to drive the three-phase motor 12, and thus the motor control apparatus 10 drives an inverter circuit 11 in order to generate driving currents Iu, Iv, and Iw for driving the three-phase motor 12 by the inverter circuit 11.

Further, the motor control system 1 according to the first embodiment uses information about a rotor rotation angle of the three-phase motor 12 in order to change a magnitude and a cycle of the driving current supplied to the three-phase motor 12 according to a rotation speed. The motor control system 1 according to the first embodiment shown in FIG. 1 acquires the information about the rotor rotation angle of the three-phase motor 12 (hereinafter referred to as rotor rotation angle information) of the rotor of the three-phase motor 12 using an angle sensor 15.

Furthermore, the motor control system 1 according to the first embodiment measures current values of the driving currents Iu, Iv, and Iw by a current sensor 13, and performs failure detection processing for detecting a rotation abnormality in the motor 12 from this measured current values. In the example shown in FIG. 1, a filter 14 is provided between the current sensor 13 and the motor control apparatus 10. The filter 14 is, for example, a low-pass filter. The filter 14 smoothes a pulsed measurement signal output from the current sensor 13 and outputs a sine wave.

The motor control system 1 according to the first embodiment has one feature in the processing in the motor control apparatus 10. FIG. 1 is a block diagram in which processing performed in the motor control apparatus 10 is divided into blocks for each processing unit. Each of these processing blocks represents a process performed by a program executed by an arithmetic unit included in the motor control apparatus 10.

As shown in FIG. 1, the motor control apparatus 10 includes a difference component generation unit 21, a control processing unit 22, a two-phase to three-phase conversion processing unit 23, a carrier conversion processing unit 24, a first analog-to-digital conversion processing unit 25, a speed conversion processing unit 26, a second analog-to-digital conversion processing unit 27, a current estimation unit 28, and a failure detection unit 29.

The difference component generation unit 21 calculates a difference between a target speed command value supplied from the outside and a current speed value generated from the rotor rotation angle information (e.g., a rotor electrical angle θ) fed back from the angle sensor 15, and supplies the calculated difference value to the control processing unit 22. The control processing unit 22 calculates a two-phase voltage command value (a d-axis voltage command value Vd and a q-axis voltage command value Vq in FIG. 1) from the difference value supplied from the difference component generation unit 21.

The two-phase to three-phase conversion processing unit 23 calculates three-phase voltage command values (a U-phase voltage command value Vu, a V-phase voltage command value Vv, and a W-phase voltage command value Vw in FIG. 1) using the d-axis voltage command value Vd, the q-axis voltage command value Vq, and the rotor electrical angle θ. The carrier conversion processing unit 24 calculates driving pulses corresponding to U, V, and W phases based on the U-phase voltage command value Vu, the V-phase voltage command value Vv, and the W-phase voltage command value Vw, respectively. This driving pulse is a PWM (Pulse Width Modulation) signal which is a differential signal for each phase.

The first analog-to-digital conversion processing unit 25 converts a rotor electrical angle signal that the angle sensor 15 outputs as an analog signal into a digital value and outputs the rotor electrical angle θ. The speed conversion processing unit 26 converts the rotor electrical angle θ into a current speed value.

The second analog-to-digital conversion processing unit 27 is, for example, a current measurement unit that measures at least two current values of the three-phase AC currents supplied to the motor as measured current values. The second analog-to-digital conversion processing unit 27 converts the current values measured by the current sensor 13 into digital values and outputs the measured current values represented by the digital values. In the motor control system 1 according to the first embodiment shown in FIG. 1, the second analog-to-digital conversion processing unit 27 outputs the measured current values for three phases including the U phase, the V phase, and the W phase (a measured current value Iu', a measured current value Iv', and a measured current value Iw' in FIG. 1).

The current estimation unit 28 outputs detected current value corresponding to each of the three-phase AC currents based on the measured current values and the rotor rotational angle information (e.g., the rotor electrical angle θ) of the motor. In the motor control system 1 according to the first embodiment shown in FIG. 1, the current estimation unit 28 outputs the detected current values for three phases including the U phase, the V phase, and the W phase (a detected current value Iu", a detected current value Iv", and a detected current value Iw' in FIG. 1').

Specifically, the current estimation unit 28 defines a phase in which a duty ratio of the driving pulse supplied to the inverter circuit 11, which generates the three-phase AC currents, becomes larger than or equal to an operation switching threshold as a estimation target phase. Further, for the estimation target phase, the current estimation unit 28 calculates estimated current values based on coefficient values, which are calculated from the measured current values acquired by the current measurement unit (e.g., the second analog-to-digital conversion processing unit 27) in a period in which the duty ratio of the motor 12 is lower than the operation switching threshold, and the rotor electrical angle θ of the motor 12. Then, the current estimation unit 28 outputs the calculated estimated current value as the detected current value of the phase to be estimated. When the duty ratio of the driving pulse to be supplied to the inverter circuit 11, which generates the three-phase AC currents, is lower than the preset operation switching threshold, the current estimation unit 28 outputs the measured current value as the detected current value. Note that the operation switching threshold used by the current estimation unit 28 is a value previously stored in a memory or the like in the motor control apparatus 10, and the duty ratio of the driving pulse is acquired from the carrier conversion processing unit 24 or the like. In FIG. 1, a transmission path of the duty ratio information from the carrier conversion processing unit 24 to the current estimation unit 28 is not shown. Details of the processing of the current estimation unit 28 will be described later.

When a sum of the three detected current values (the detected current value Iu", the detected current value Iv", and the detected current value Iw" in FIG. 1) exceeds a preset abnormality determination threshold, the failure detection unit 29 detects that a failure has occurred in the motor 12. When the failure detection unit 29 detects a failure in the motor 12, it performs predetermined processing such as transmitting a notification about the occurrence of the abnormality to a higher-level system (not shown).

Figure 2:
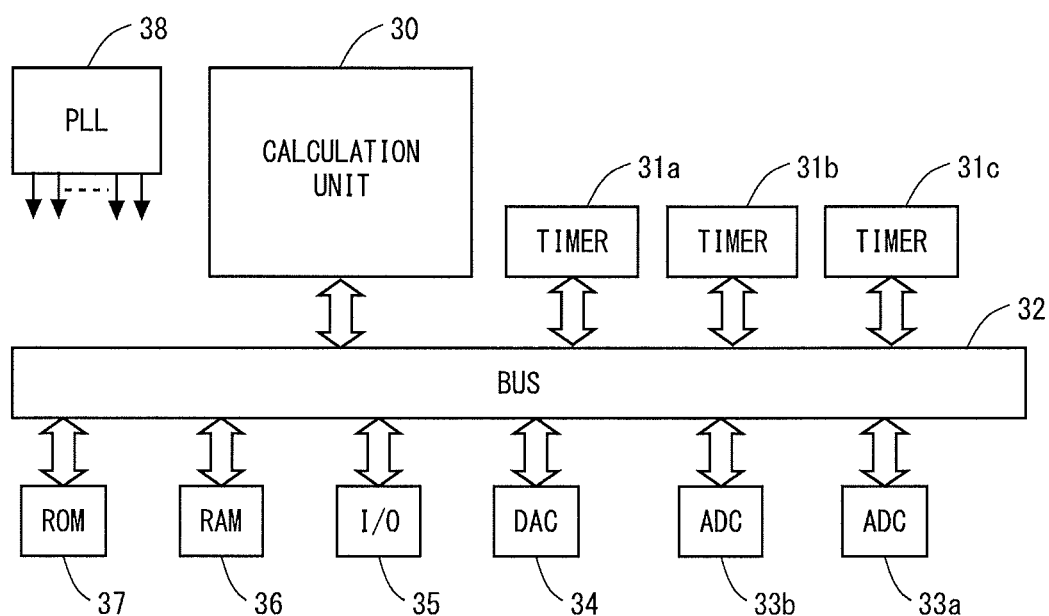
FIG. 2 is a block diagram of a control microcontroller according to the first embodiment.

Here, the motor control apparatus 10 uses a semiconductor device such as a microcontroller. This microcontroller includes an arithmetic unit and a peripheral circuit used by the arithmetic unit. FIG. 2 is a block diagram of the control microcontroller according to the first embodiment. The microcontroller shown in FIG. 2 is an example of the motor control apparatus 10.

As shown in FIG. 2, the motor control apparatus 10 includes an arithmetic unit 30, timers 31a to 31c, a bus 32, analog-to-digital conversion circuits 33a and 33b, a digital-to-analog conversion circuit 34, an input/output interface circuit 35, a RAM 36, a ROM 37, and a PLL circuit 38.

The motor control apparatus 10 operates a circuit block based on a clock signal generated by the PLL circuit 38. Then, the arithmetic unit 30 executes a motor control program for controlling the three-phase motor 12 and for failure detection processing. The timers 31a to 31c count the clock signal with a predetermined setting based on the program executed by the arithmetic unit 30. The driving pulse can also be generated using functions of these timers.

The bus 32 mediates transmission and reception of data between the arithmetic unit 30 and other circuit blocks. The analog-to-digital conversion circuits 33a and 33b output digital values corresponding to analog values (e.g., voltage values of the signals) of the input analog signals and transmit the digital values to the arithmetic unit 30. In the motor control apparatus 10, the analog-to-digital conversion circuit 33a operates as the first analog-digital conversion processing unit 25, and the analog-digital conversion circuit 33b operates as the second analog-to-digital conversion processing unit 27.

The digital-to-analog conversion circuit 34 converts the digital value generated by the arithmetic unit 30 into an analog value and outputs the analog value to the outside. The input/output interface circuit 35 transmits and receives data between the motor control apparatus 10 and an external device. The target speed command value is supplied to the motor control apparatus 10 via the input/output interface circuit 35. The RAM 36 is used in the processing performed by the arithmetic unit 30. The ROM 37 stores, for example, the motor control program. The arithmetic unit 30 reads the motor control program from the ROM 37 and executes it.

Figure 3:
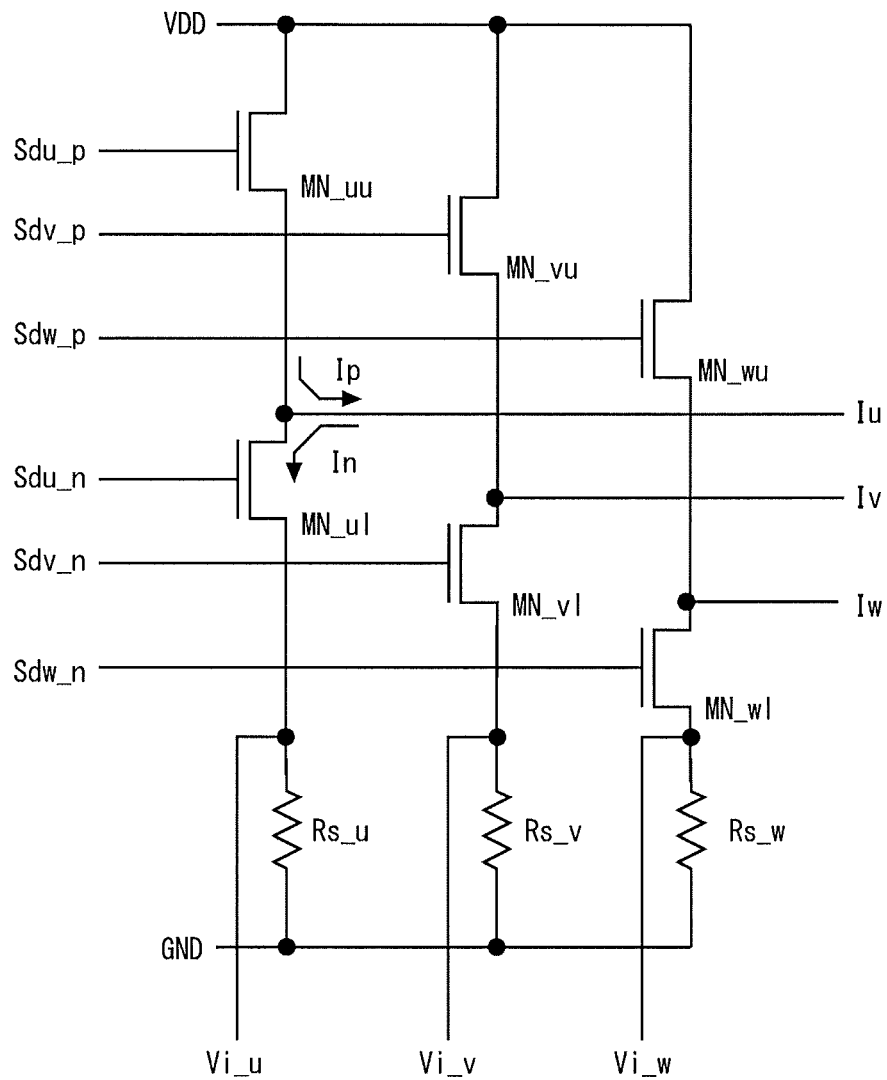
FIG. 3 is a circuit diagram of an inverter circuit according to the first embodiment.

Next, the inverter circuit 11 will be described in detail. FIG. 3 is a circuit diagram of the inverter circuit according to the first embodiment. As shown in FIG. 3, the inverter circuit 11 includes inverter circuits corresponding to the U phase, V phase, and W phase, respectively. In the example shown in FIG. 3, an NMOS transistor MN_uu, an NMOS transistor MN_ul, and a current sense resistor Rs_u constitute an inverter circuit corresponding to the U phase. An NMOS transistor MN_vu, an NMOS transistor MN_vl, and a current sense resistor Rs_v constitute an inverter circuit corresponding to the V phase. An NMOS transistor MN_wu, an NMOS transistor MN_wl, and a current sense resistor Rs_w constitute an inverter circuit corresponding to the W phase.

The inverter circuits corresponding to the respective phases have the same circuit configuration, and thus a connection relation of elements of the inverter circuits will be described using the inverter circuit corresponding to the U phase as an example. The drain of the NMOS transistor MN_uu is connected to a power supply line VDD. A driving pulse Sdu_p is input to the gate of the NMOS transistor MN_uu. The source of the NMOS transistor MNuu is connected to the drain of the NMOS transistor MN_ul. A driving pulse Sdu_n is input to the gate of the NMOS transistor MN_ul. The source of the NMOS transistor MNul is connected to a ground line GND via the current sense resistor Rs_u. The driving current Iu is output from a node connecting the source of the NMOS transistor MN_uu to the drain of the NMOS transistor MN_ul. Further, a current measurement voltage Vi_u is output from a node connecting the source of the NMOS transistor MN_ul to the current sense resistor Rs_u.

This inverter circuit outputs an outflow current Ip and increases the amount of the driving current Iu in a period in which the driving pulse Sdu_p is at a high level and the driving pulse Sdu_n is at a low level. On the other hand, the inverter circuit draws a drawing current In to lower an amount of the driving current Iu in a period in which the driving pulse Sdu_p is at a low level and the driving pulse Sdu_n is at a high level. Here, in the inverter circuit, when the duty ratio of the driving pulse Sdu_p is high, a voltage change of the current measurement voltage Vi_u becomes small, causing a problem that a part of the waveform of the measured current value Iu' is missing. This missing current waveform will be described below.

Figure 4:
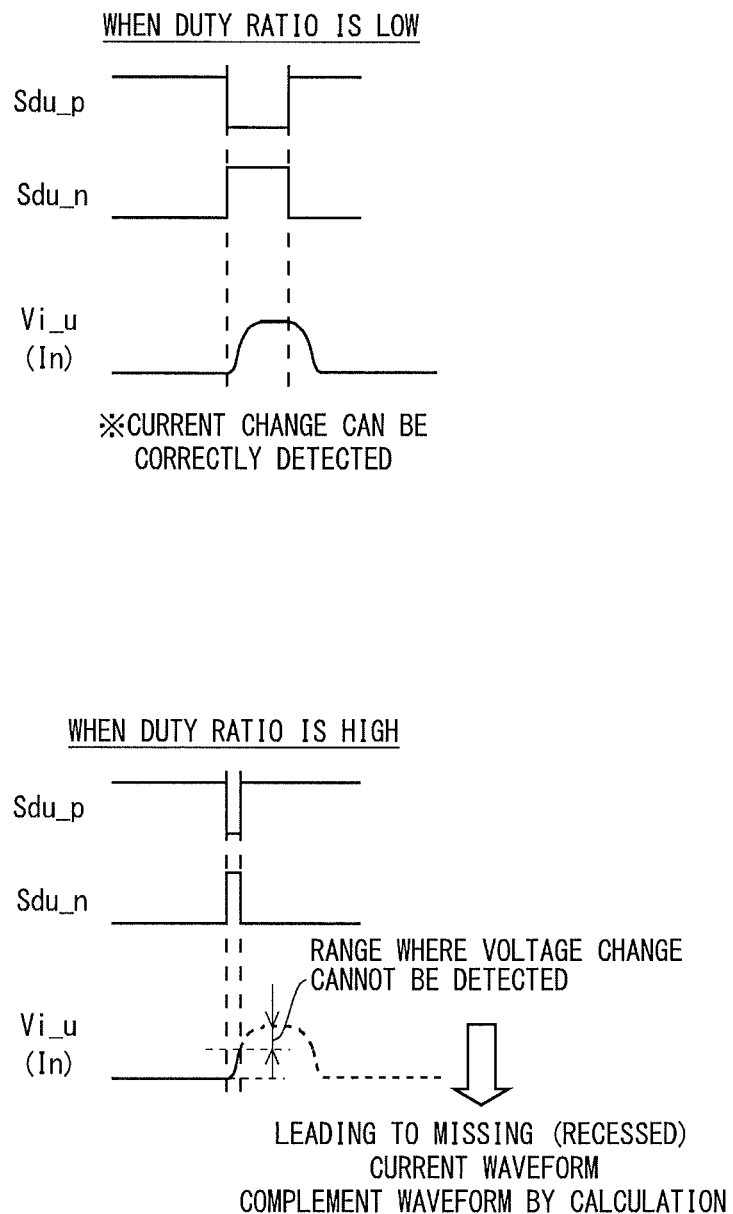
FIG. 4 is a timing chart for describing a relationship between a driving pulse and a current measurement voltage supplied to the inverter circuit according to the first embodiment.

FIG. 4 is a timing chart for describing a relationship between the driving pulse and the current measurement voltage supplied to the inverter circuit according to the first embodiment. In FIG. 4, the upper drawing is a timing chart when the duty ratio of the driving pulse is low, and the lower drawing is a timing chart when the duty ratio of the driving pulse is high.

As shown in FIG. 4, when the duty ratio of the driving pulse is low, the current of the drawing current In rises until it saturates. Thus, the current measurement voltage Vi rises to a voltage value assumed in advance. On the other hand, when the duty ratio of the driving pulse is high, the period in which the NMOS transistor MN_ul is on is short, and the drawing current In will not rise until it saturates, and thus a voltage change in the current measurement voltage Vi_u is small. Therefore, when the duty ratio of the driving pulse is high, the current sensor 13 cannot detect the voltage change corresponding to the current change, and a part of the current waveform is missing.

Thus, in a period in which the duty ratio of the driving pulse becomes more than or equal to the preset operation switching threshold, the motor control system 1 according to the first embodiment performs current estimation processing in which the measured current values in this period are replaced by estimated current values estimated from calculation to be used for subsequent processing. Hereinafter, this current estimation processing will be described in more detail.

First, the motor control system 1 according to the first embodiment performs the failure detection processing for detecting a rotation abnormality in the three-phase motor 12 based on the measured current value. This failure detection processing will be described below. The driving current Iu, the driving current Iv, and the driving current Iw satisfy the relationship of Formula (1) in a normal state.

$$Iu+Iv+Iw=0 \quad (1)$$

Here, when any one of the driving current Iu, the driving current Iv, and the driving current Iw is abnormal, the relation of Formula (1) is no longer satisfied. When the three-phase driving current no longer satisfies the relation of Formula (2), the motor control system 1 according to the first embodiment determines that there is a failure. In Formula (2), the ERR is a predetermined determination threshold.

$$|Iu+Iv+Iw| \geq ERR \quad (2)$$

Figure 5:
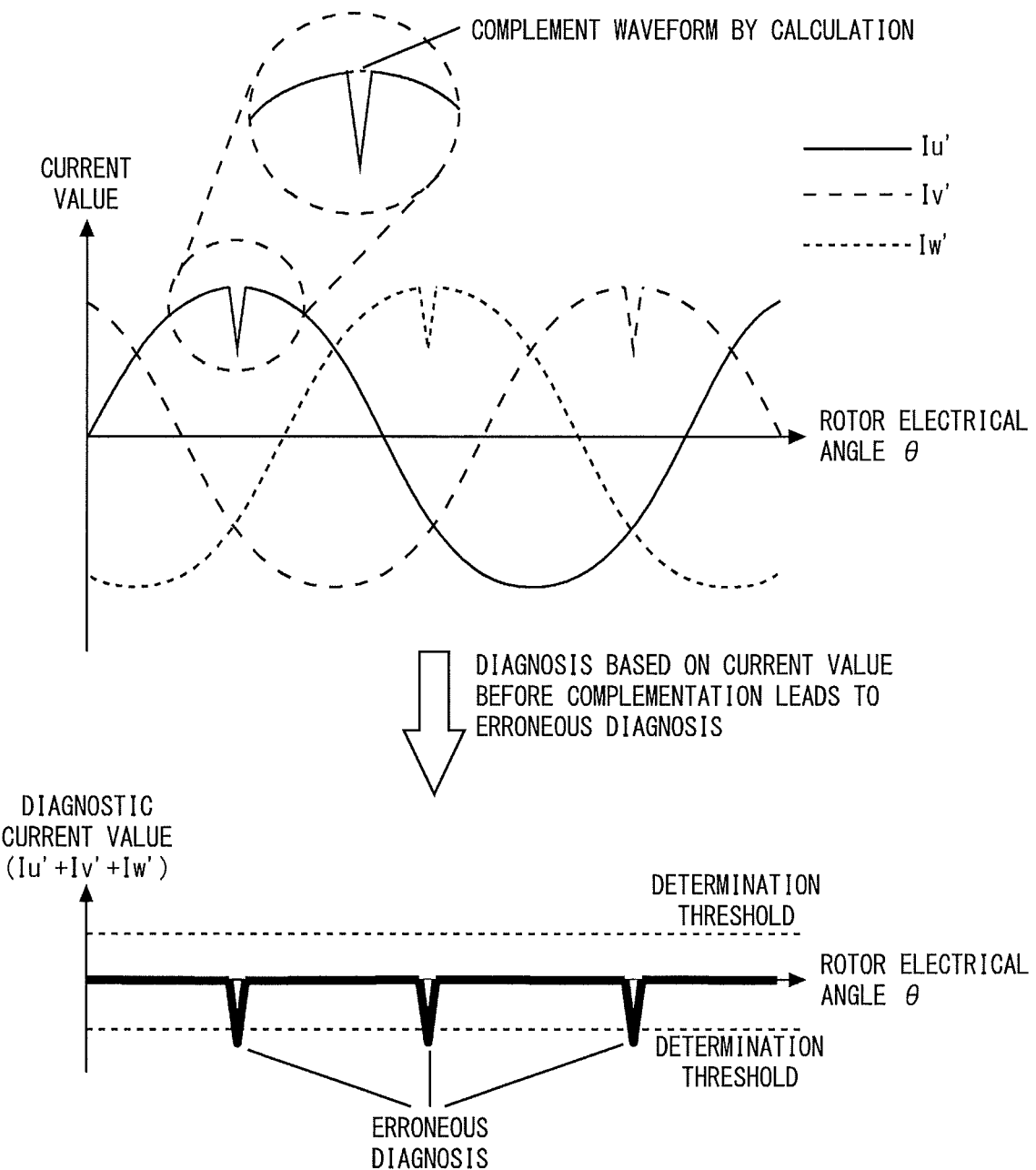
FIG. 5 is a timing chart showing waveforms of detected current values when current estimation processing is not performed and a waveform of a diagnostic current value assumed in failure diagnosis processing in the motor control system according to the first embodiment.

Next, FIG. 5 is a timing chart showing waveforms of detected current values when current estimation processing is not performed and a waveform of a diagnostic current value assumed in failure diagnosis processing in the motor control system according to the first embodiment.

As shown in FIG. 5, when the current estimation processing is not performed, a part of the waveform of the measured current is missing in a period in which the driving current becomes large (i.e., a period in which the duty ratio of the driving pulse is high). For this reason, when a failure diagnosis based on Formula (2) is performed according to the measured current including this missing waveform, an erroneous diagnosis could occur at a part where there is no abnormality. It is necessary to set a large determination threshold ERR in order to avoid this erroneous diagnosis, which causes the accuracy of the failure detection processing to decrease. In order to address this issue, the motor control system 1 according to the first embodiment complements the measured current value in a period in which a part of the waveform is missing by replacing the measured current value by the calculated estimated current value.

Figure 6:
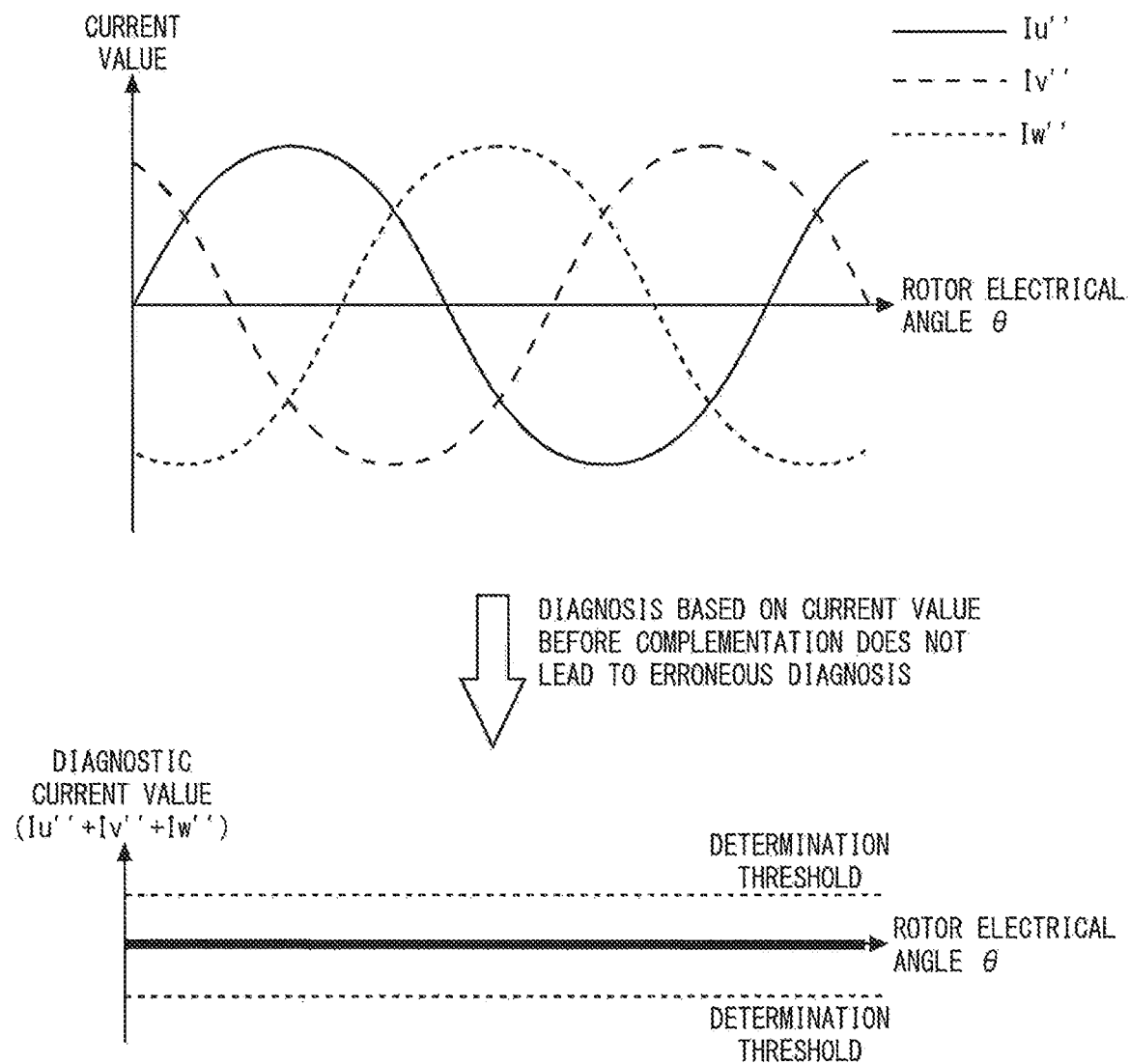
FIG. 6 is a timing chart showing waveforms of detected current values when current estimation processing is not performed and a waveform of a diagnostic current value assumed in failure diagnosis processing in the motor control system according to the first embodiment.

Next, FIG. 6 is a timing chart showing waveforms of detected current values when current estimation processing is performed in the motor control system according to the first embodiment and a waveform of a diagnostic current value assumed in the failure diagnosis processing.

As shown in FIG. 6, when the current estimation processing is performed, no missing waveform as shown in FIG. 5 occurs in the waveform of the detected current value generated after the current estimation processing. Thus, when the failure detection processing is performed based on the detected current values, an erroneous diagnosis as shown in FIG. 5 does not occur. As a result, the motor control system 1 according to the first embodiment can lower the determination threshold ERR and improve the accuracy of failure detection.

Figure 7:
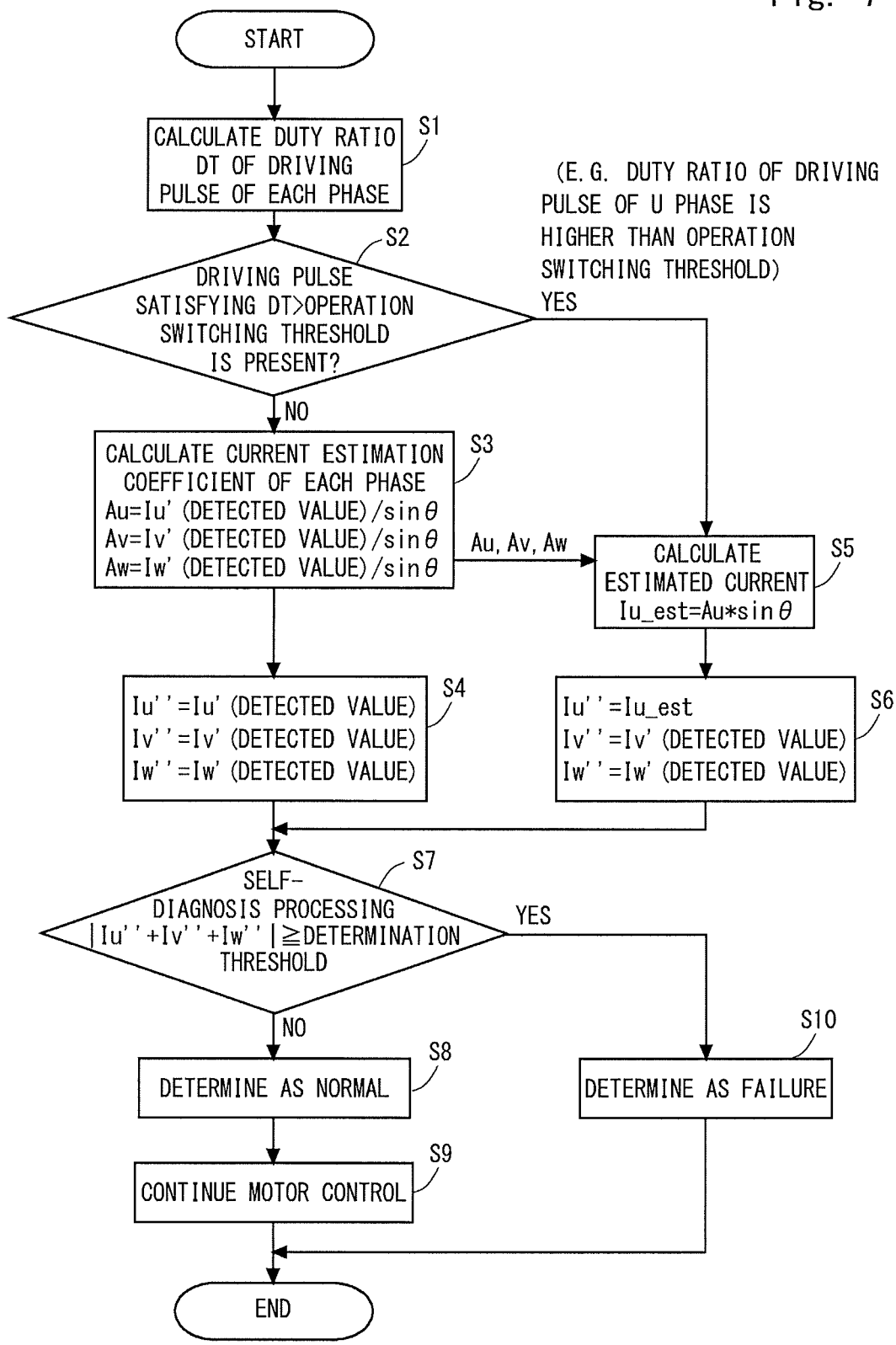
FIG. 7 is a flowchart showing a flow of the current estimation processing and the failure diagnosis processing in the motor control system according to the first embodiment.

Next, a flow of the current estimation processing and the failure detection processing in the motor control system 1 according to the first embodiment will be described. FIG. 7 is a flowchart for describing the flow of current estimation processing and the failure diagnosis processing in the motor control system according to the first embodiment. In the example shown in FIG. 7, the duty ratio of the U-phase driving pulse is higher than the operation switching threshold. When the duty ratios of the phases other than the U phase are higher than the operation switching threshold, substantially the same processing is performed with a different phase to be estimated in Steps S5 and S6. The processing shown in FIG. 7 is repeated at predetermined intervals much shorter than one cycle of the driving current.

As shown in FIG. 7, in the motor control system 1 according to the first embodiment, the current estimation unit 28 first calculates the duty ratio DT of the driving pulse of each phase (Step S1). Then, as a result of the calculation in Step S1, when there is a phase whose duty ratio is determined to be higher than the operation switching threshold, the current estimation unit 28 performs the processing of Step S5 (a flow of YES of Step S2), whereas when there is no phase whose duty ratio is determined to be higher than the operation switching threshold, the processing of Step S3 is performed (a flow of NO of Step S2).

In the processing of Step S3, the current estimation unit 28 calculates the coefficient values Au, Av, and Aw by dividing the measured currents of the respective phases that have been measured at that time by the rotor rotation angle θ (sin θ). The coefficient values Au, Av, and Aw calculated in this Step S3 are stored in, for example, the RAM 36. After that, the current estimation unit 28 outputs the measured currents (e.g., the measured current value Iv', and the measured current value Iw') used in the calculation of Step S3 to the failure detection unit 29 as the detected current values of the corresponding phases (e.g., the detected current value Iu", the detected current value Iv", and the detected current value Iw") (Step S4).

On the other hand, in the processing of Step S5, the current estimation unit 28 calculates an estimated current value Iu_est at that time using the coefficient value Au calculated in Step S3. In the calculation of Step S5, a value obtained by multiplying the coefficient value Au by the rotor rotation angle θ (sin θ) is calculated as the estimated current value Iu_est. After that, the current estimation unit 28 uses the measured current values of the V and W phases, which are not calculated in Step S5, as the detected current values and outputs the estimated current value Iu_est for the U phase, which has been calculated in Step S5, to the failure detection unit 29 (Step S6) as the detected current value Iu".

Next, the failure detection unit 29 applies the detected current values Iu", Iv", and Iw" output in Step S4 or S6 to Formula (2) to perform self-diagnosis processing (Step S7). In the self-diagnosis processing, when it is determined that Formula (2) holds true, the failure detection unit 29 determines that a rotation abnormality has not occurred in the motor 12 (Step S8). Further, the motor control system 1 continues the motor control (Step S9). On the other hand, when it is determined that Formula (2) does not hold true in the self-diagnosis processing, the failure detection unit 29 determines that a rotation abnormality has occurred in the motor 12 (Step S10) and transmits a notification about the abnormality to a higher-level system.

Note that the current estimation unit 28 calculates the coefficient values by dividing the measured current values, which are acquired by the current measurement unit in the period in which the duty ratio of the driving pulse is lower than the operation switching threshold for the respective phases of the three-phase AC currents, by the value of the rotor rotation angle information at the time when the measured current values are measured. The current estimation unit 28 updates the coefficient value each time the measured current value is input in the period in which the duty ratio of the driving pulse is lower than the operation switching threshold.

As described above, the motor control system 1 according to the first embodiment outputs the detected current values using the estimated current values estimated from the coefficient values and the rotor rotation angle θ instead of the measured current values in the period in which the duty ratio of the driving pulse is larger than or equal to the preset operation switching threshold. By doing so, the motor control system 1 according to the first embodiment improves the accuracy of control performed thereafter.

In particular, the motor control system 1 according to the first embodiment performs the abnormality detection processing for detecting a rotation abnormality in the three-phase motor 12 using the detected current values. By doing so, the motor control system 1 according to the first embodiment can improve the accuracy of this abnormality detection processing. Further, the motor control system 1 according to the first embodiment uses the measured current values as the detected current values as they are in the period in which the duty ratio of the driving pulse is larger than or equal to the preset operation switching threshold. Then, the motor control system 1 according to the first embodiment can perform processing based on the actual measured current values.

Second Embodiment

In a motor control system according to the second embodiment, another mode of calculating coefficient values Au, Av, and Aw in the current estimation unit 28 will be described. Specifically, the current estimation unit 28 according to the second embodiment does not use the rotor rotation angle acquired from the angle sensor 15, and instead estimates a rotor rotation angle θ from the measured current values of two phases to calculate the coefficient values using the estimated rotor rotation angle θ.

More specifically, it is known that the measured current values of the two phases have a predetermined relationship when they reach a predetermined rotor rotation angle θ. Thus, the current estimation unit 28 according to the second embodiment estimates the rotor rotation angle θ by a simple calculation in which the rotor rotation angle θ is estimated when the measurement of the two phases is completed.

Figure 8:
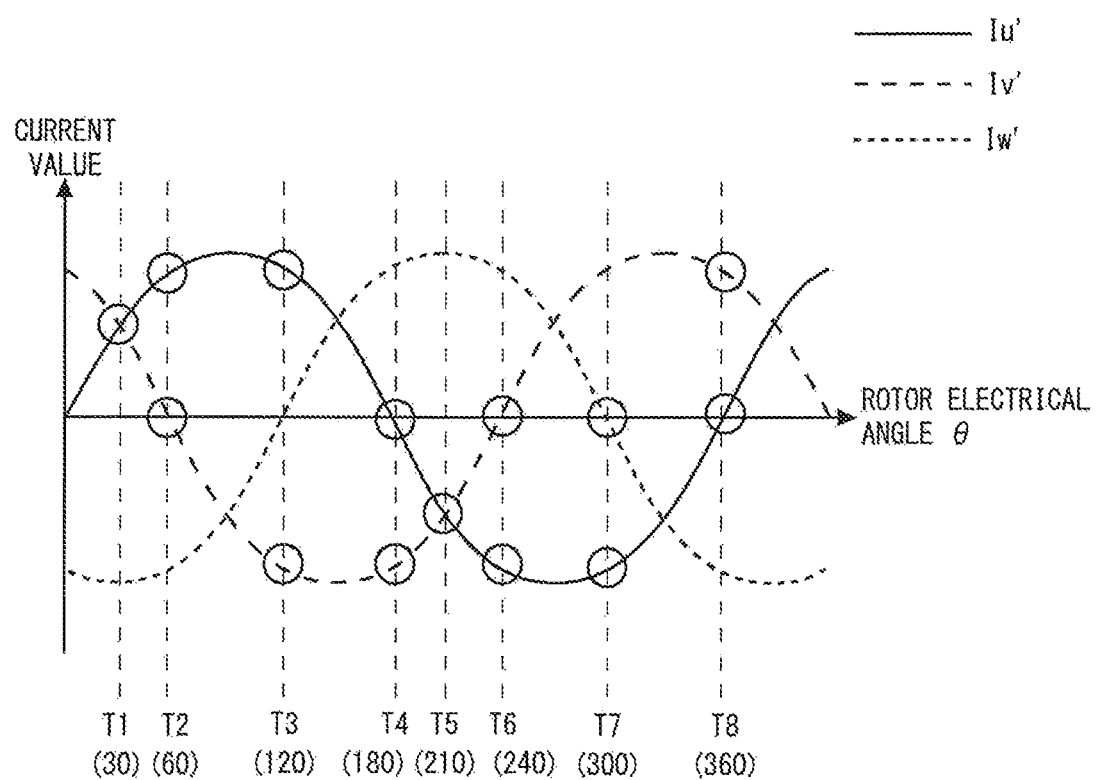
FIG. 8 is a timing chart for describing a timing at which processing for estimating a motor rotation angle is performed in a motor control system according to a second embodiment.

FIG. 8 is a timing chart for describing a timing at which processing for estimating a motor rotation angle is performed in the motor control system according to the second embodiment. In the example shown in FIG. 8, the relationship between the measured current value Iu' of the U phase and the measured current value Iv' of the V-phase is focused on, and the rotor rotation angle θ is estimated. Further, FIG. 8 shows an example in which the rotor rotation angle θ is estimated at eight timings where the U-phase measured current value Iu' and the V-phase measured current value Iv' take characteristic values.

As shown in FIG. 8, when the U-phase measured current value Iu' and the V-phase measured current value Iv' satisfy the following relationships (T1) to (T8), the rotor rotation angle θ is estimated to be a predetermined angle (a rotor rotation angle estimated value θ_est).

$$|Iu'|=|Iv'| \text{ and } Iu'>0, Iv'>0: \theta\_est=30° \tag{T1}$$

$$|Iv'|=0 \text{ and } Iu'>0: \theta\_est=60° \tag{T2}$$

$$|Iu'|=|Iv'| \text{ and } Iu'>0, Iv'<0: \theta\_est=120° \tag{T3}$$

$$|Iu'|=0 \text{ and } Iv'>0: \theta\_est=180° \tag{T4}$$

$$|Iu'|=|Iv'| \text{ and } Iu'<0, Iv'<0: \theta\_est=210° \tag{T5}$$

|Iv'|=0 and Iu'<0:θ_est=240°  (T6)

|Iu'|=|Iv'| and Iu'<0,Iv'>0:θ_est=300°  (T7)

|Iu'|=0 and Iv'>0:θ_est=360°  (T8)

Figure 9:
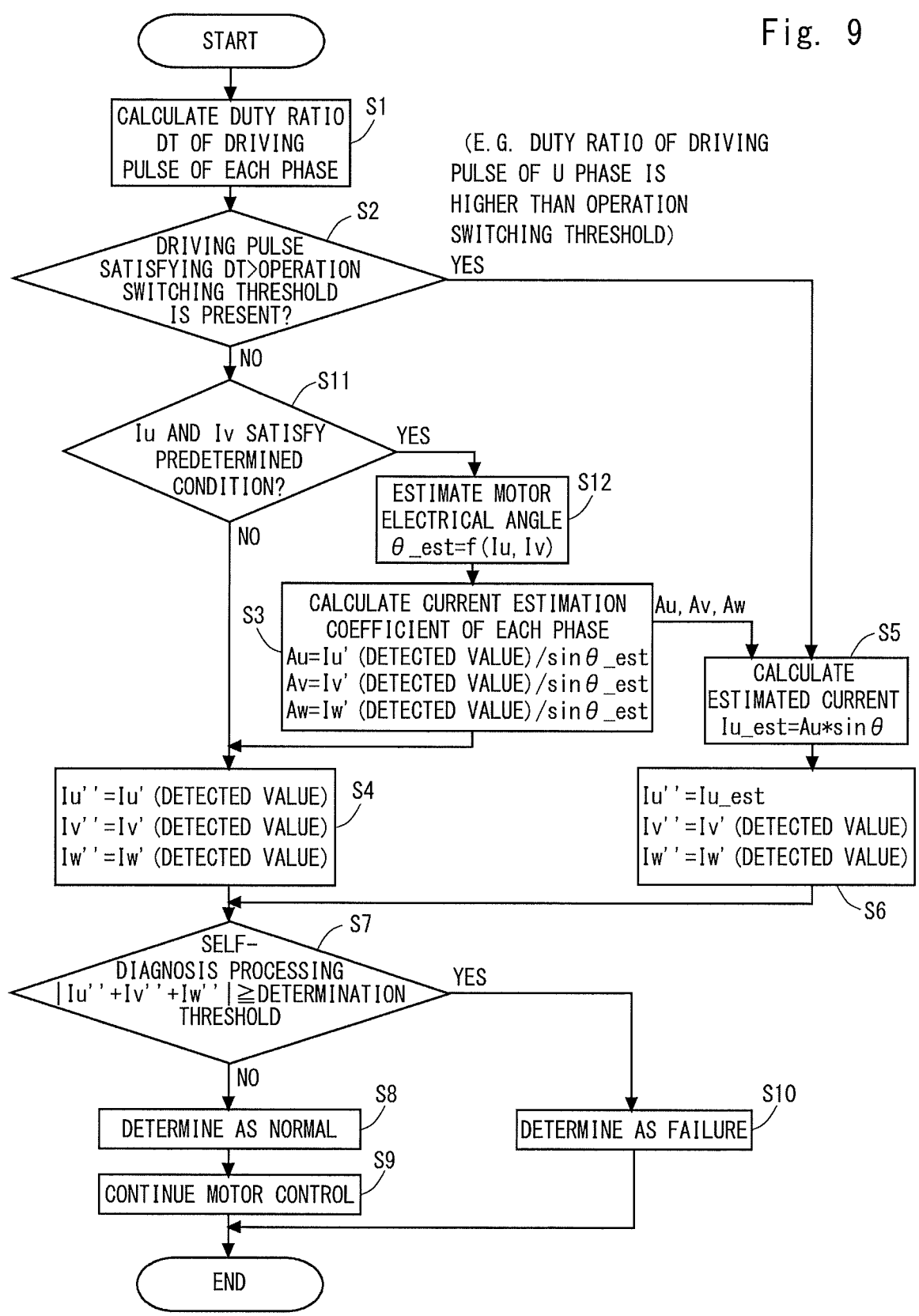
FIG. 9 is a flowchart showing a flow of current estimation processing and the failure diagnosis processing in the motor control system according to the second embodiment.

Next, the current estimation processing and the failure diagnosis processing in the motor control system according to the second embodiment will be described. FIG. 9 is a flowchart for describing a flow of the current estimation processing and the failure diagnosis processing in the motor control system according to the second embodiment.

As shown in FIG. 9, in the current estimation processing and the failure diagnosis processing in the motor control system according to the second embodiment, the processing of Steps S11 and S12 is added to the flowchart shown in FIG. 7. Step S11 is a process performed after it is determined that there is no driving pulse whose duty ratio is larger than or equal to the operation switching threshold (a flow of NO of Step S2). In Step S11, it is determined whether the measured current value Id and the measured current value Iv' satisfy predetermined conditions indicated by T1 to T8 in FIG. 8. When it is determined in Step S11 that the measured current value Iu' and the measured current value Iv' do not satisfy the predetermined condition, the current estimation unit 28 outputs the detected current values for the three phases by performing the processing of Step S4.

On the other hand, when it is determined in Step S11 that the measured current value Iu' and the measured current value Iv' satisfy the predetermined condition, the current estimation unit 28 determines which one of the conditions indicated by T1 to T8 the measured current value Iu' and the measured current value Iv' meet in order to calculate the rotor rotation angle estimated value θ_est (Step S12). Then, the current estimation unit 28 calculates the coefficient values Au, Av, and Aw using the rotor rotation angle estimated value θ_est estimated in Step S12 and the measured current values (Step S3).

In the second embodiment as well, the current value estimation processing is performed using the rotor rotation angle θ obtained from the angle sensor 15 in the process of Step S5 for calculating the estimated current value.

As described above, in the motor control system 1 according to the second embodiment, the current estimation unit 28 performs the following operation. In the following descriptions, the measured current value corresponding to one phase among the three-phase AC currents (the driving current Iu, the driving current Iv, the driving current Iw) is defined as a first rotor position detected current value, and the measured current value corresponding to another phase among the three-phase AC currents is defined as a second rotor position detected current value. When the relationship between first rotor position detected current value and the second rotor position detected current value matches preset rotor position feature point information (e.g., T1 to T8 in FIG. 8), the current estimation unit 28 calculates the rotor rotation angle value determined corresponding to the rotor position feature point information as the rotor rotation angle estimated value θ_est indicating the rotor rotation angle of the motor. Then, the current estimation unit 28 performs coefficient estimation processing for calculating the coefficient value by dividing the first rotor position detected current value by the rotor rotation angle estimated value, and also outputting the first rotor position detected current value and the second rotor position detected current value as the detected current values (e.g., the detected current value Iu" and the detected current value Iv").

In the second embodiment, the rotor rotation angle θ is not used for calculating the rotor rotation angle estimated value. The timing at which the angle sensor 15 outputs the rotor rotation angle θ does not necessarily match the timing at which the measured current value is acquired. Thus, when the angle sensor 15 uses the rotor rotation angle θ for calculating the coefficient value, the accuracy of the coefficient value may decrease. However, when the rotor rotation angle estimated value is calculated based on the measured current values of the two phases, it is possible to acquire the rotor rotation angle at the timing when the measured current values are acquired. Thus, the coefficient values can be made close to values desired to be acquired by calculating the coefficient values using the rotor rotation angle estimated value, thereby reducing an erroneous component included in the coefficient values. Therefore, the accuracy of the estimated current value is improved in the second embodiment.

Further, in the second embodiment, the rotor rotation angle θ acquired from the angle sensor 15 is not used for calculating the coefficient values. For this reason, the accuracy of the angle sensor 15 or the output frequency of the rotor rotation angle θ can be lowered.

In the above descriptions, it is determined whether the predetermined condition is satisfied for the measured current values of the U-phase and the V-phase. However, processing similar to the one described above can be performed using two different phases. That is, the V phase and W phase or the U phase and W phase can also be used as the two measurement currents to be verified.

Third Embodiment

A motor control system 3 will be described in a third embodiment. In the motor control system described in the first and second embodiments, a failure in the three-phase motor 12 is determined based on the measured current values of the three phases. However, in the motor control system 3 according to the third embodiment, measured currents of two phases among measured currents of three phases are acquired, and the acquired measured currents of the two phases are used as a feedback signal when the rotation of the three-phase motor 12 is controlled. That is, the motor control system 3 according to the third embodiment uses the measured currents for controlling the motor and not for detecting a failure.

In the description of the third embodiment, the same reference numerals as those in the first and second embodiments denote the same components as those described in the first and second embodiments, and descriptions thereof will be omitted.

Figure 10:
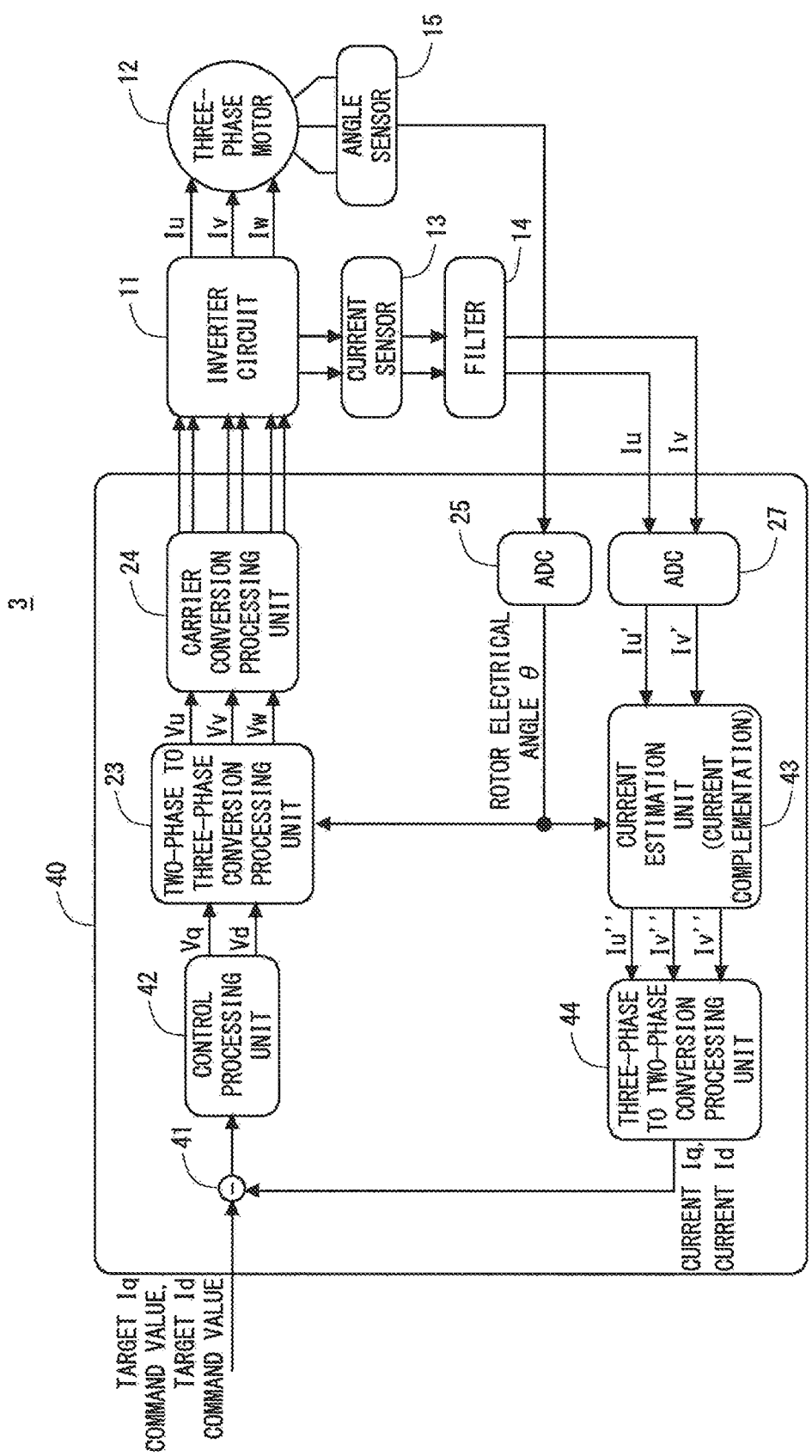
FIG. 10 is a block diagram of a motor control system according to a third embodiment.

FIG. 10 is a block diagram of the motor control system 3 according to the third embodiment. As shown in FIG. 10, in the motor control system 3 according to the third embodiment, the difference component generation unit 21, the control processing unit 22, and the current estimation unit 28 are replaced by a difference component generation unit 41, a control processing unit 42, and a current estimation unit 43, respectively. In the motor control system 3 according to the third embodiment, the speed conversion processing unit 26 of the motor control system 1 according to the first embodiment is eliminated, and a three-phase to two-phase conversion processing unit 44 is further included.

The difference component generation unit 41 generates differences between a target q-axis current command value Iq and a target d-axis current command value and a current q-axis current command value Iq and a target d-axis current command value Id, respectively, and supplies the calculated difference values to the control processing unit 42. The current q-axis current command value Iq and the target d-axis current command value Id are generated from the measured current values acquired by the motor control apparatus 40 as a feedback signal. The control processing unit 42 calculates two-phase voltage command values (a d-axis voltage command value Vd and a q-axis voltage command value Vq in FIG. 10) from the difference values supplied from the difference component generation unit 41.

In the motor control apparatus 40, the second analog-to-digital conversion processing unit 27 acquires the driving currents Iu and Iv related to the two phases among the driving currents Iu, Iv, and Iw generated by the inverter circuit 11, and then outputs a first measured current value (e.g., the measured current value Iu') and a second measured current value (e.g., the measured current value Iv') as the measured current values corresponding to these driving currents.

The current estimation unit 43 outputs a first detected current value (e.g., the measured current value Iu') corresponding to the first measured current value (e.g., the measured current value Iu") and a second detected current value (e.g., the measured current value Iv") corresponding to the second measured current value (e.g., the detected current value Iv'). Further, the current estimation unit 43 calculates a value obtained by subtracting the detected current value Iv" from a value obtained by making the detected current value Iu" negative as a third detected current value (e.g., the detected current value Iw"), and outputs the detected current value Iw" together with the detected current value Iu" and the detected current value Iv".

The three-phase to two-phase conversion processing unit 44 calculates the two-phase current command values (a current d-axis current command value Id and the current q-axis current command value Iq in FIG. 10) corresponding to the current rotation speed from the three-phase detected current values.

Figure 11:
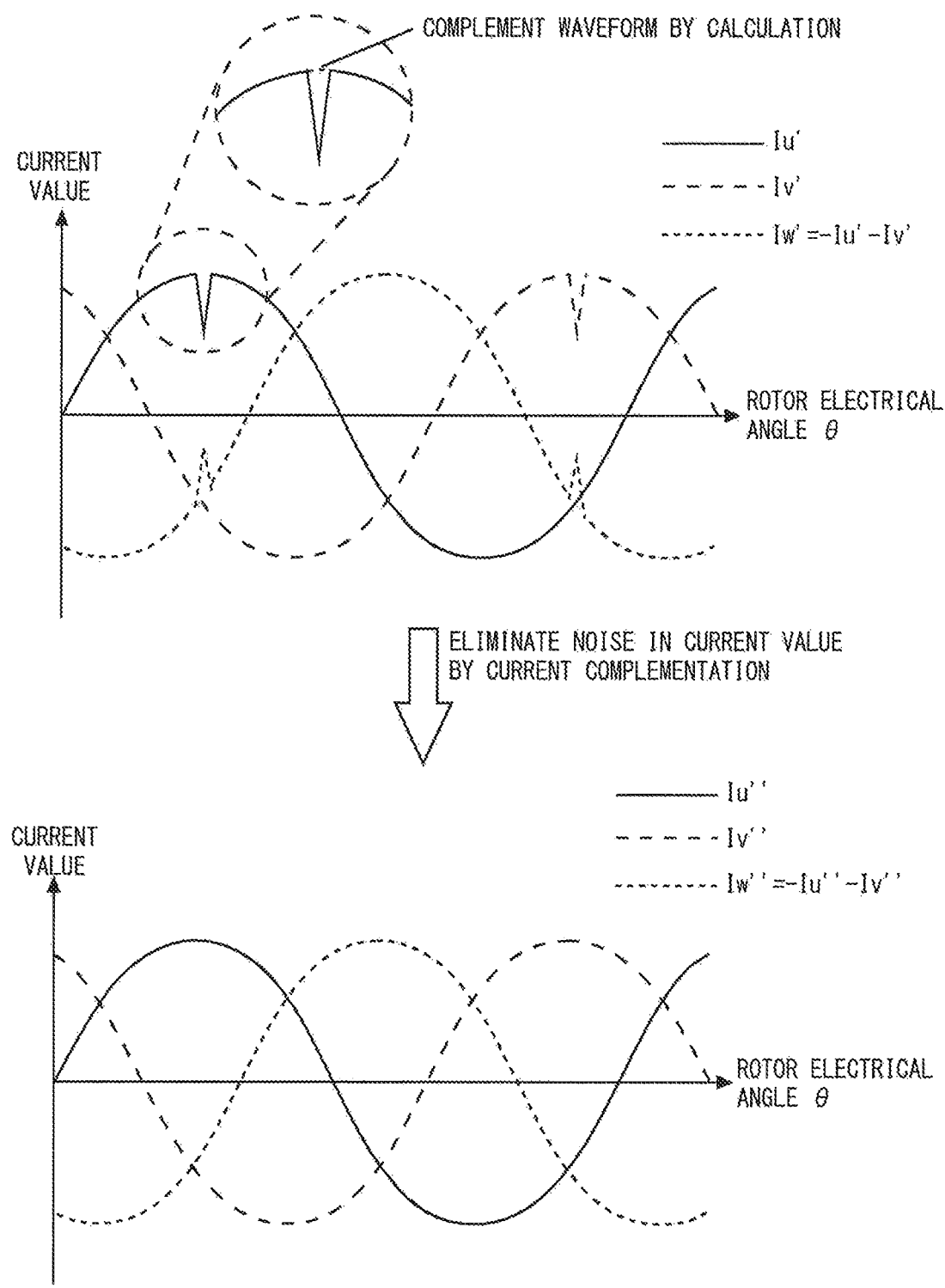
FIG. 11 is a timing chart showing waveforms of detected current values before and after the current estimation processing in the motor control system according to the third embodiment.

Next, the measured current values and the detected current values used in the motor control system 3 according to the third embodiment will be described. FIG. 11 is a timing chart showing waveforms of the detected current values before and after the current estimation processing is performed in the motor control system 3 according to the third embodiment.

As shown in FIG. 11, in the motor control system 3 according to the third embodiment, the measured current of the W phase from which the measured current is not acquired is complemented using a calculation formula of Iw'=−Iu'−Iv' using the known measured current value Iu' and the known measured current value Iv'. When the current estimation processing according to the third embodiment is not performed, the influence of the missing measured current value occurring in the period in which the duty ratio of the driving pulse is low also appears in the measured current value Iw' calculated as a complementary value. However, such a missing waveform will not occur by calculating the detected current value Iw" of the W phase based on the detected current value after the current estimation processing according to the third embodiment is performed.

Figure 12:
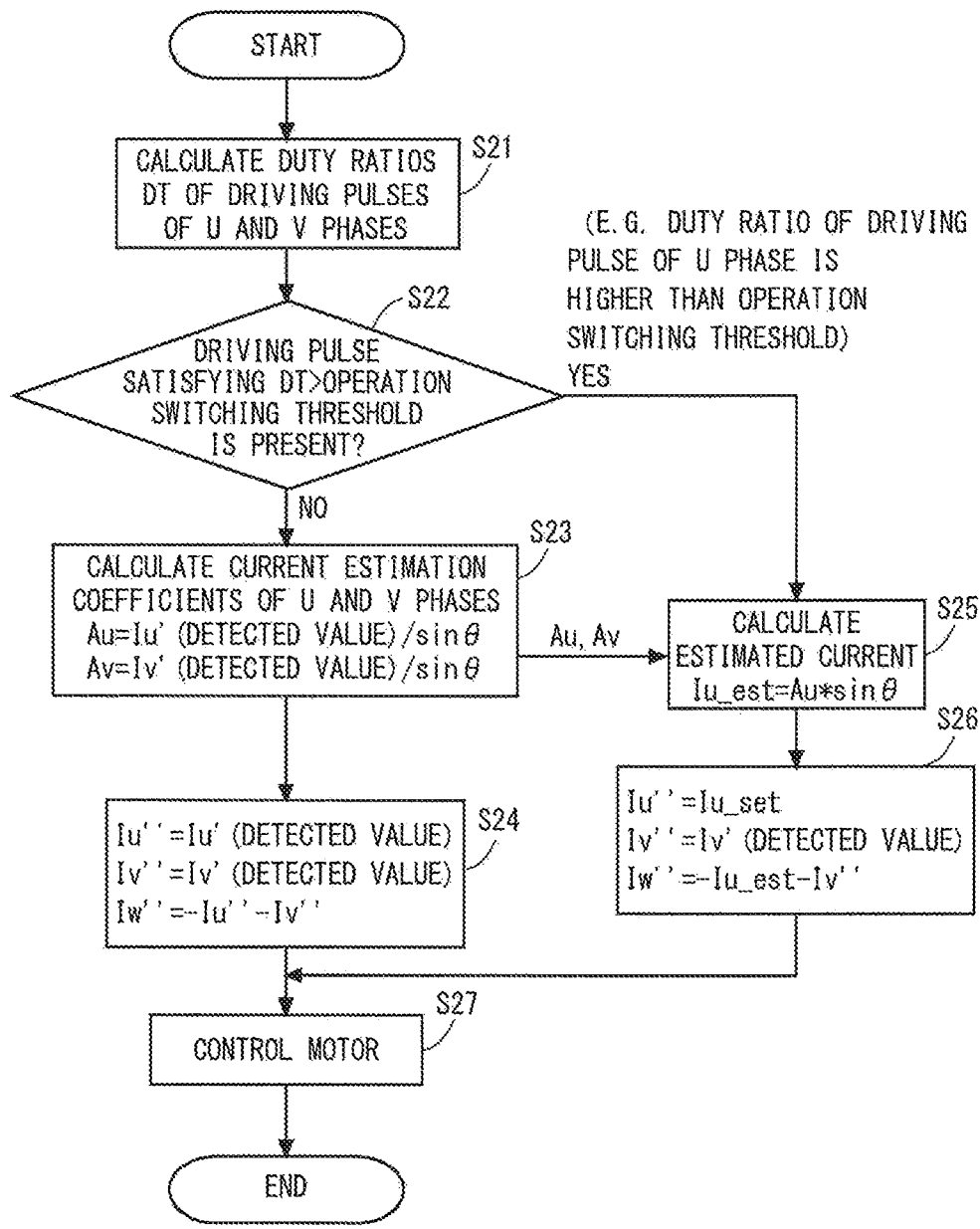
FIG. 12 is a flowchart for describing a flow of the current estimation processing in the motor control system according to the third embodiment.

The current estimation processing according to the third embodiment will be described below. FIG. 12 is a flowchart for describing a flow of the current estimation processing in the motor control system 3 according to the third embodiment. In the example shown in FIG. 12, the duty ratio of the U-phase driving pulse is higher than the operation switching threshold. When the duty ratios of the phases other than the U phase are higher than the operation switching threshold, substantially the same processing as that shown in FIG. 12 is performed with a different phase to be estimated in Steps S25 and S26. The processing shown in FIG. 12 is repeated at predetermined intervals much shorter than one cycle of the driving current.

As shown in FIG. 12, in the motor control system 3 according to the third embodiment, firstly, the current estimation unit 43 calculates the duty ratios DT of the U phase and V phase driving pulses (Step S21). Then, when it is determined that there is a phase whose duty ratio is higher than the operation switching threshold as a result of the calculation in Step S21, the current estimation unit 43 performs the processing of Step S25 (a flow of YES of Step S22), whereas when it is determined that there is no phase whose duty ratio is higher than the operation switching threshold, the processing of Step S23 is performed (a flow of NO of Step S22).

In the processing of Step S23, the current estimation unit 43 calculates the coefficient values Au and Av by dividing the measured currents of the U phase and the V phase measured at that time by the rotor rotation angle θ (sin θ). The coefficient values Au and Av calculated in this Step S23 are stored in, for example, the RAM 36. After that, the current estimation unit 43 outputs the measured currents (e.g., the measured current value Iu' and the measured current value Iv') used in the calculation of Step S23 to the failure detection unit 29 as the detected current values of the corresponding phases (e.g., the detected current value Iu", the detected current value Iv", and the detected current value Iw") (Step S24). The detected current value Iw" here is a complementary value calculated from the formula Iw"=−Iu"−Iv".

On the other hand, in the processing of Step S25, the current estimation unit 43 calculates the estimated current value Iu_est at this time using the coefficient value Au calculated in Step S23. In the calculation of Step S25, a value obtained by multiplying the coefficient value Au by the rotor rotation angle θ (sin θ) is calculated as the estimated current value Iu_est. The current estimation unit 43 uses the measured current value of the V phase, which is not calculated in Step S25, as the detected current value, uses the estimated current value Iu_est as the detected current value Iu" for the U phase, which is calculated in Step S25, and uses the detected current value Iw" calculated from the formula of Iw"=−Iu_est−Iv" for the W phase. Then, the current estimation unit 43 outputs these detected current values to the three-phase to two-phase conversion processing unit 44 (Step S26).

After that, the three-phase to two-phase conversion processing unit 44 calculates the current q-axis current command value Iq and the target d-axis current command value Id using the three detected current values supplied from the current estimation unit 43. The motor control apparatus 40 controls the three-phase motor 12 using the current q-axis current command value Iq and the target d-axis current command value Id.

Note that the current estimation unit 43 calculates the coefficient values by dividing the measured current values, which are acquired by the current measurement unit in the period in which the duty ratio of the driving pulse is lower than the operation switching threshold for the respective phases of the three-phase AC current, by the value of the rotor rotation angle information at the time when the measured current values are measured. The current estimation unit 43 updates the coefficient value every time the measured current value is input in the period in which the duty ratio of the driving pulse is lower than the operation switching threshold.

As described so far, the motor control system 3 according to the third embodiment complements the missing measured current value used in the feedback control of the three-phase motor 12 by the estimated current value to generate the detected current value without a missing waveform. Then, the motor control system 3 generates the detected current value of the third phase using the two-phase detected current values corresponding to the two-phase measured current values generated by the current estimation unit 43. Thus, the motor control system 3 according to the third embodiment can perform highly accurate motor control based on a feedback value without a missing waveform.

Fourth Embodiment

In a motor control system according to a fourth embodiment, another mode of calculating coefficient values Au and Av in a current estimation unit 43 will be described. Specifically, the current estimation unit 43 according to the fourth embodiment does not use the rotor rotation angle acquired from the angle sensor 15, and instead estimates a rotor rotation angle θ from the measured current values of two phases to calculate the coefficient value using the estimated rotor rotation angle θ.

More specifically, it is known that the measured current values of the two phases have a predetermined relationship when they reach a predetermined rotor rotation angle θ. Thus, the current estimation unit 28 according to the second embodiment estimates the rotor rotation angle θ by a simple calculation in which the rotor rotation angle θ is estimated when the measurement of the two phases is completed.

Figure 13:
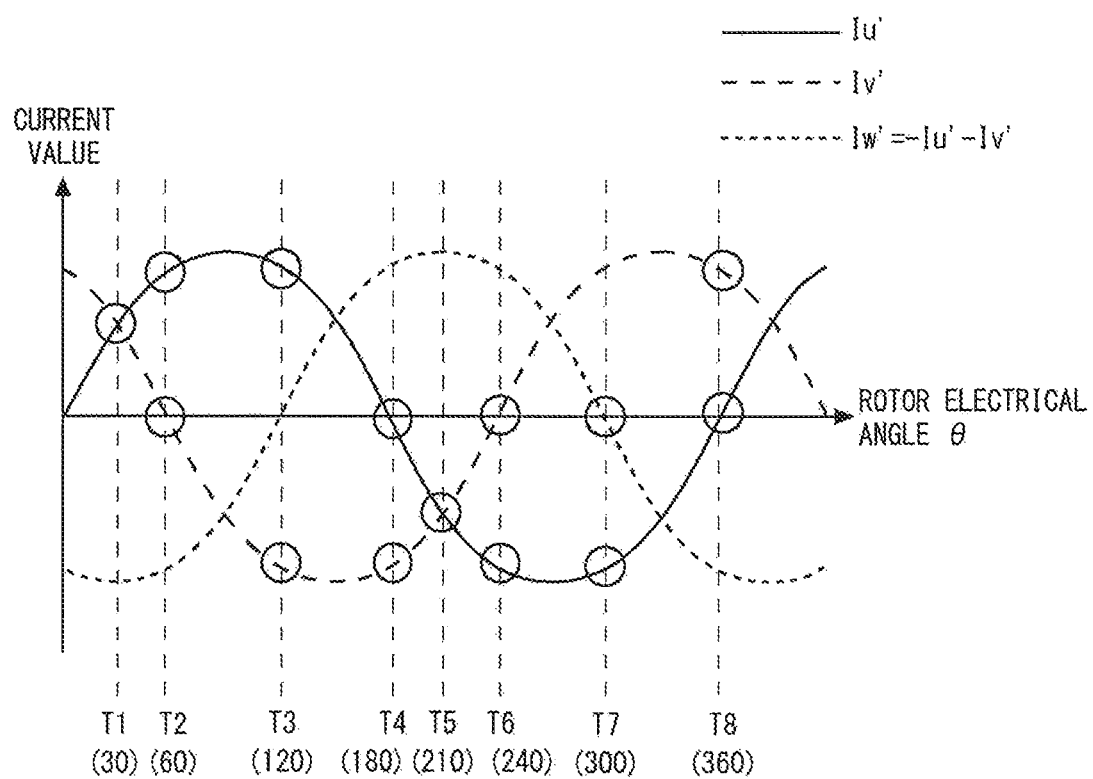
FIG. 13 is a timing chart for describing a timing at which processing for estimating a motor rotation angle is performed in a motor control system according to a fourth embodiment.

FIG. 13 is a timing chart for describing a timing at which processing for estimating a motor rotation angle is performed in a motor control system according to the fourth embodiment. In the example shown in FIG. 13, the relationship between the measured current value Iu' of the U phase and the measured current value Iv' of the V-phase is focused on, and the rotor rotation angle θ is estimated. Further, FIG. 8 shows an example in which the rotor rotation angle θ is estimated at eight timings where the U-phase measured current value Iu' and the V-phase measured current value Iv' take characteristic values. Note that the measured current value Iw' of the W phase is a complementary value calculated using the measured current value Iu' of the U-phase and the measured current value Iv' of the V-phase.

As shown in FIG. 13, when the U-phase measured current value Iu' and the V-phase measured current value Iv' satisfy the following relationships (T1) to (T8), the rotor rotation angle θ is estimated to be a predetermined angle (a rotor rotation angle estimated value θ_est).

$|Iu'|=|Iv'|$ and $Iu'>0, Iv'>0: \theta\_est=30°$ (T1)

$|Iv'|=0$ and $Iu'>0: \theta\_est=60°$ (T2)

$|Iu'|=|Iv'|$ and $Iu'>0, Iv'<0: \theta\_est=120°$ (T3)

$|Iu'|=0$ and $Iv'>0: \theta\_est=180°$ (T4)

$|Iu'|=|Iv'|$ and $Iu'<0, Iv'<0: \theta\_est=210°$ (T5)

$|Iv'|=0$ and $Iu'<0: \theta\_est=240°$ (T6)

$|Iu'|=|Iv'|$ and $Iu'<0, Iv'>0: \theta\_est=300°$ (T7)

$|Iu'|=0$ and $Iv'>0: \theta\_est=360°$ (T8)

Figure 14:
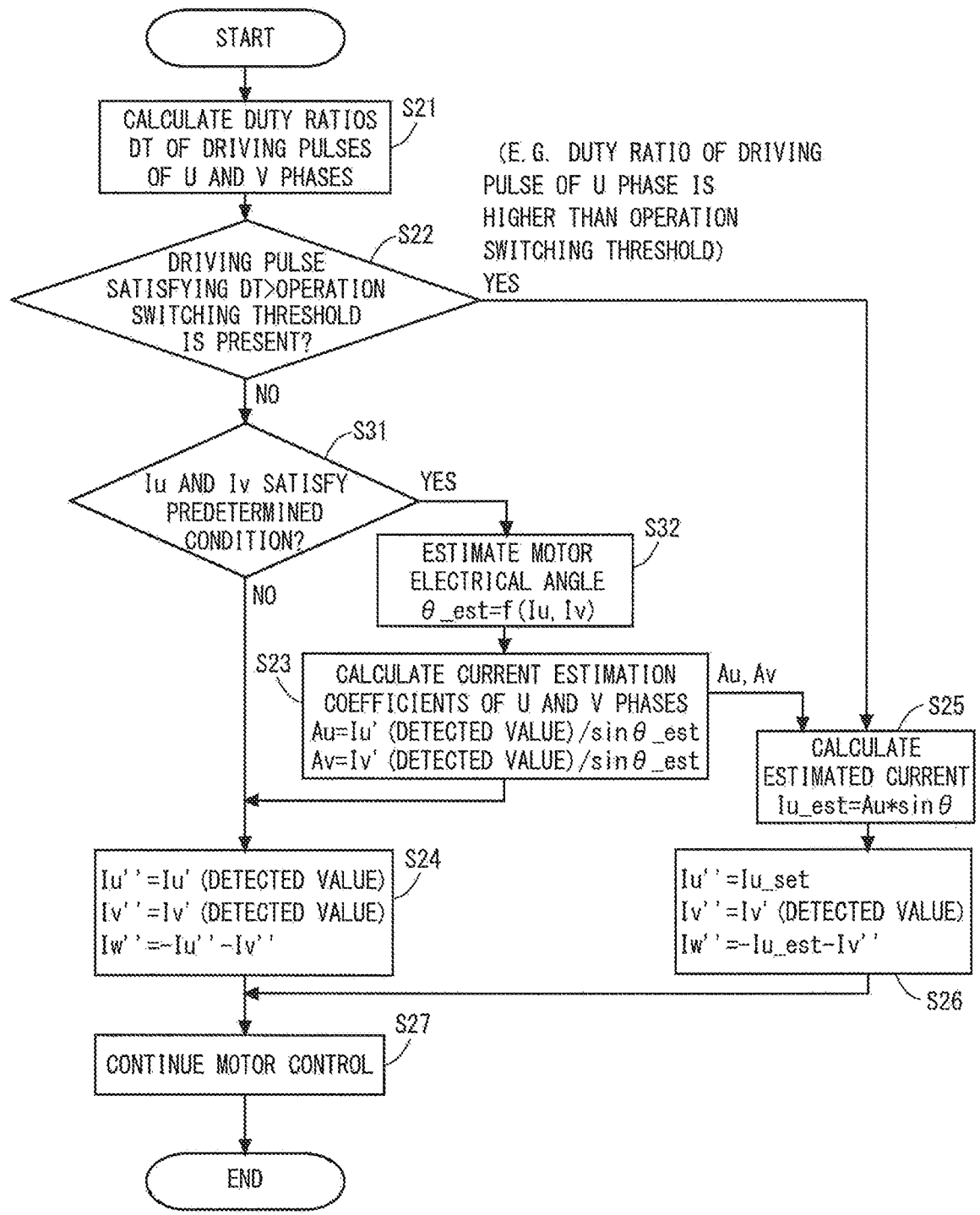
FIG. 14 is a flowchart for describing a flow of current estimation processing in the motor control system according to the fourth embodiment.

Next, the current estimation processing and the failure diagnosis processing in the motor control system according to the fourth embodiment will be described. FIG. 14 is a flowchart for describing a flow of the current estimation processing and the failure diagnosis processing in the motor control system according to the fourth embodiment.

As shown in FIG. 14, in the current estimation processing and the failure diagnosis processing in the motor control system according to the fourth embodiment, the processing of Steps S31 and S32 is added to the flowchart shown in FIG. 12. Step S31 is a process performed after it is determined that there is no driving pulse whose duty ratio is larger than or equal to the operation switching threshold (a flow of NO of Step S22). In Step S31, it is determined whether the measured current value Iu' and the measured current value Iv' satisfy predetermined conditions indicated by T1 to T8 in FIG. 13. When it is determined in Step S31 that the measured current value Iu' and the measured current value Iv' do not satisfy the predetermined condition, the current estimation unit 43 outputs the detected current values for the three phases by performing the processing of Step S24.

On the other hand, when it is determined in Step S31 that the measured current value Iu' and the measured current value Iv' satisfy the predetermined condition, the current estimation unit 43 determines which one of the conditions indicated by T1 to T8 the measured current value Iu 'and the measured current value Iv' meet in order to calculate the rotor rotation angle estimated value θ_est (Step S32). Then, the current estimation unit 43 calculates the coefficient values Au and Av using the rotor rotation angle estimated value θ_est estimated in Step S32 and the measured current values (Step S23).

In the fourth embodiment, the current value estimation processing is performed using the rotor rotation angle θ obtained from the angle sensor 15 in the processing of Step S25 for calculating the estimated current value.

As described above, in the motor control system 1 according to the fourth embodiment, the current estimation unit 28 performs the following operation. In the following descriptions, the measured current value corresponding to one phase among the three-phase AC currents (the driving current Iu, the driving current Iv, the driving current Iw) is defined as a first rotor position detected current value, and the measured current value corresponding to another phase among the three-phase AC currents is defined as a second rotor position detected current value. When the relationship between first rotor position detected current value and the second rotor position detected current value matches preset rotor position feature point information (e.g., T1 to T8 in FIG. 8), the current estimation unit 28 calculates the rotor rotation angle value determined corresponding to the rotor position feature point information as the rotor rotation angle estimated value θ_est indicating the rotor rotation angle of the motor. Then, the current estimation unit 28 performs coefficient estimation processing for calculating the coefficient value by dividing the first rotor position detected current value by the rotor rotation angle estimated value, and also outputting the first rotor position detected current value and the second rotor position detected current value as the detected current values (e.g., the detected current value Iu" and the detected current value Iv").

In the fourth embodiment, the rotor rotation angle θ is not used for calculating the rotor rotation angle estimated value. The timing at which the angle sensor 15 outputs the rotor rotation angle θ does not necessarily match the timing at which the measured current value is acquired. Thus, when the angle sensor 15 uses the rotor rotation angle θ for calculating the coefficient value, the accuracy of the coefficient value may decrease. However, when the rotor rotation angle estimated value is calculated based on the measured current values of the two phases, it is possible to acquire the rotor rotation angle at the timing when the measured current values are acquired. Thus, the coefficient values can be made close to values desired to be acquired by calculating the coefficient values using the rotor rotation angle estimated value, thereby reducing an erroneous component included in the coefficient values. Therefore, the accuracy of the estimated current value is improved in the fourth embodiment.

Further, in the fourth embodiment, the rotor rotation angle θ acquired from the angle sensor 15 is not used for calculating the coefficient values. For this reason, the accuracy of the angle sensor 15 or the output frequency of the rotor rotation angle θ can be lowered.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A motor control apparatus for feedback-controlling a motor driven by three-phase AC currents, the motor control apparatus comprising:
    a current measurement unit configured to measure at least two current values among the three-phase AC currents supplied to the motor as measured current values; and
    a current estimation unit configured to output a detected current value corresponding to each of the three-phase AC currents based on the measured current values and a rotor rotation angle of the motor, wherein
    the current estimation unit:
        for each phase of the three-phase AC currents, calculates a coefficient value by dividing the measured current value obtained by the current measurement unit in a period in which a duty ratio of a driving pulse is lower than an operation switching threshold by a value of the rotor rotation angle of the motor at the time when the measured current value is measured;
        for each phase of the three-phase AC currents, updates the coefficient value each time the measured current value is input in the period in which the duty ratio of the driving pulse is lower than the operation switching threshold;
        defines a phase whose duty ratio of a driving pulse supplied to an inverter circuit, which generates the three-phase AC currents, becomes more than or equal to the operation switching threshold as an estimation target phase;
        calculates, for the estimation target phase, an estimated current value based on the coefficient value and the rotor rotation angle of the motor; and
        outputs the calculated estimated current value as the detected current value of the estimation target phase.

2. The motor control apparatus according to claim 1, wherein
    the current measurement unit outputs the three measured current values corresponding to respective phases of the three-phase AC currents,
    the current estimation unit outputs the three detected current values corresponding to respective phases of the three-phase AC currents, and
    the motor control apparatus further comprises a failure detection unit configured to detect that a failure has occurred in the motor when a sum of the three detected current values exceeds a preset abnormality determination threshold.

3. The motor control apparatus according to claim 1, wherein
    the current measurement unit outputs the two measured current values corresponding to two phases among the phases of the three-phase AC currents as a first measured current value and a second measured current value, respectively, and
    the current estimation unit:
    outputs a first detected current value corresponding to the first measured current value and a second detected current value corresponding to the second measured current value,
    calculates a value obtained by subtracting the second detected current value from a value obtained by making the first detected current value negative as a third detected current value, and
    outputs the third detected current value together with the first detected current value and the second detected current value.

4. The motor control apparatus according to claim 1, wherein, when the measured current value corresponding to one of the phases of the three-phase AC currents is defined as a first rotor position detected current value and the measured current value corresponding to another one of the phases of the three-phase AC currents is defined as a second rotor position detected value and a relationship between the first rotor position detected current value and the second rotor position detected current value matches preset rotor position feature point information, the current estimation unit performs coefficient estimation processing in which:
    a value of a rotor rotation angle determined corresponding to the preset rotor position feature point information is calculated as a rotor rotation angle estimated value indicating the rotor rotation angle of the motor,
    the coefficient value is calculated by dividing the first rotor position detected current value by the rotor rotation angle estimated value, and
    the first rotor position detected current value and the second rotor position detected current value are output as the detected current values.

5. The motor control apparatus according to claim 1, wherein when the duty ratio of the driving pulse supplied to the inverter circuit is lower than the operation switching threshold, the current estimation unit outputs the measured current value as the detected current value.

6. A non-transitory computer readable medium storing a motor control program executed by an arithmetic unit of a motor control apparatus for feedback-controlling a motor comprising the arithmetic unit for executing a program and a current measurement unit for measuring, as measured current values, at least two current values of three-phase AC currents that drive the motor, the motor control program executing:
    current estimation processing that outputs a detected current value corresponding to each of the three-phase AC currents based on the measured current values and a rotor rotation angle of the motor, wherein the current estimation processing includes:
        for each phase of the three-phase AC currents, calculating a coefficient value by dividing the measured current value obtained by the current measurement unit in a period in which a duty ratio of a driving pulse is lower than an operation switching threshold by a value of the rotor rotation angle of the motor at the time when the measured current value is measured;

for each phase of the three-phase AC currents, updating the coefficient value each time the measured current value is input in the period in which the duty ratio of the driving pulse is lower than the operation switching threshold;

defining a phase whose duty ratio of a driving pulse supplied to an inverter circuit, which generates the three-phase AC currents, becomes more than or equal to the operation switching threshold as an estimation target phase;

calculating, for the estimation target phase, an estimated current value based on the coefficient value and the rotor rotation angle of the motor; and outputting the calculated estimated current value as the detected current value of the estimation target phase.

7. A motor control method of a motor control apparatus comprising a current measurement unit for measuring, as measured current values, at least two current values of three-phase AC currents to be supplied to a motor and a current estimation unit for outputting a detected current value corresponding to each of the three-phase AC currents based on the measured current values and a rotor rotation angle of the motor, the motor control method comprising:

for each phase of the three-phase AC currents, calculating, via the current estimation unit, a coefficient value by dividing the measured current value obtained by the current measurement unit in a period in which a duty ratio of a driving pulse is lower than an operation switching threshold by a value of the rotor rotation angle of the motor at the time when the measured current value is measured;

for each phase of the three-phase AC currents, updating, via the current estimation unit, the coefficient value each time the measured current value is input in the period in which the duty ratio of the driving pulse is lower than the operation switching threshold defining, via the current estimation unit, a phase whose duty ratio of a driving pulse supplied to an inverter circuit, which generates the three-phase AC currents, becomes more than or equal to the operation switching threshold as an estimation target phase;

calculating, via the current estimation unit and for the estimation target phase, an estimated current value based on the coefficient value and the rotor rotation angle of the motor; and outputting, via the current estimation unit, the calculated estimated current value as the detected current value of the estimation target phase.

* * * * *